(12) United States Patent
Cramer

(10) Patent No.: US 6,675,633 B2
(45) Date of Patent: Jan. 13, 2004

(54) METHOD FOR SEAL TESTING CAPACITIVE SENSORS

(75) Inventor: Wolfgang Cramer, Owen-Teck (DE)

(73) Assignee: Conti Temic microelectronic GmbH, Nuremberg (DE)

(*) Notice: Subject to any disclaimer, the term of this patent is extended or adjusted under 35 U.S.C. 154(b) by 0 days.

(21) Appl. No.: 10/191,034

(22) Filed: Jul. 3, 2002

(65) Prior Publication Data
US 2003/0019282 A1 Jan. 30, 2003

(30) Foreign Application Priority Data
Jul. 25, 2001 (DE) .......................... 101 36 219

(51) Int. Cl.$^7$ .................. G01M 3/34; G01R 27/26
(52) U.S. Cl. .................. 73/49.3; 324/658; 324/659
(58) Field of Search .................. 73/49.3; 209/574; 324/382, 658, 659; 365/201; 438/621

(56) References Cited

U.S. PATENT DOCUMENTS
5,872,309 A 2/1999 Pinter

FOREIGN PATENT DOCUMENTS
| | | |
|---|---|---|
| DE | 19651384 | 6/1998 |
| DE | 19924369 | 11/2000 |
| WO | WO 86/05880 | 10/1986 |

*Primary Examiner*—Hezron Williams
*Assistant Examiner*—Jay L Politzer
(74) *Attorney, Agent, or Firm*—W. F. Fasse; W. G. Fasse

(57) ABSTRACT

1. Method for testing the tightness of capacitive sensors
   2.1. Known methods of seal testing cannot be used because of the extremely small volume of the sensor cavity or on wafer level. Other known methods of seal testing are only possible with high expenditure on safety because, for example, radio isotopes are used.
   2.2. Method for testing the tightness of capacitive sensors arranged in a hermetically sealed enclosure, in which the processed sensors are arranged in the form of a wafer, wherein the already sawn wafer bearing the sensors is immersed in a test fluid under defined conditions, the capacitance of each sensor is then measured and compared with the capacitance of reference sensors.
   2.3. The invention is especially suitable for testing the tightness of capacitive, hermetically sealed sensors.

18 Claims, 3 Drawing Sheets

METHOD FOR SEAL TESTING CAPACITIVE SENSORS

BACKGROUND OF THE INVENTION

The present invention relates to a method for seal testing capacitive sensors, arranged in a hermetically sealed enclosure, in which the processed sensors are arranged in the form of a wafer.

Acceleration sensors manufactured by surface micromechanical engineering frequently work according to the capacitive measuring principle. Such an acceleration sensor is shown in FIG. 4a. In the capacitive measuring principle, a moveable test mass, with electrode combs (so-called moving fingers) attached to the sides, is suspended on tiny silicon springs in such a manner that it is deflected by accelerations in the sensitive direction. In so doing, the capacitance between the fixed and the moveable electrodes is increased on one side of the test mass and decreased on the other side. The sensor fingers, which are electrically isolated from one another, thus form a differential capacitor with a capacitance of around 600 fF.

It is absolutely essential to protect the processed wafers from moisture, particles and other mechanical influences by means of a cover in the form of a hermetically sealing lid made of silicon or a similar material.

Known leak and seal testing methods for testing the hermeticity according to MIL or EN standards (for example the "bubble test" or "coarse leak" according to MIL method 1014) cannot be used because of the extremely small volume of the sensor cavity. Other known methods of seal testing, either cannot be used at wafer level or can only be used with high expenditure on safety because of the use of radio isotopes, such as krypton 85, and therefore cannot be used for series production because the costs are too high.

SUMMARY OF THE INVENTION

The object of the invention is to provide a testing method, with which capacitive sensors can be tested for tightness cost-effectively, reliably and in an environmentally compatible manner.

According to the invention, there is a method for testing the tightness of capacitive sensors arranged in a hermetically sealed enclosure, in which the processed sensors are arranged in the form of a wafer, in which the already sawn wafer bearing the sensors is immersed in a test fluid under defined conditions, the capacitance of each sensor is then measured and compared with the capacitance of reference sensors.

The method according to the invention possesses the advantages that the test fluid, with defined dielectrical properties, penetrating into the cavity enables the finest leaks, up into the so-called coarse leak range ($10^{-3}$ to $10^{-5}$ mbar·dm$^3$·s$^{-1}$), to be detected by clearly measurable capacitance changes. A further advantage lies in the fact that the test method can be applied as an "inline test method", that is the seal test can be integrated into the normal wafer test in the form of 100% testing at wafer level without incurring additional testing time. Moreover, no negative effects (damage by oxidation, corrosion etc.) on the test piece are to be expected as a consequence of using the test fluids. Furthermore, no reaction is expected with the wafer clamped on foil.

The invention is particularly suitable for leak and sealing tests for micromechanically constructed and hermetically sealed capacitive sensors, in particular acceleration sensors.

Advantageous embodiments of the method according to claim 1 are stated in the subclaims.

BRIEF DESCRIPTION OF THE DRAWINGS

The invention is explained in the following by means of an embodiment and with the aid of the drawings.

They show:

FIG. 4b: the principle of operation of the conventional acceleration sensor shown in FIG. 4a, and FIG. 4c: the equivalent circuit diagram for the conventional acceleration sensor shown in FIG. 4a.

DESCRIPTION OF THE PREFERRED EMBODIMENTS

Figures 4A, 4B, 4C:
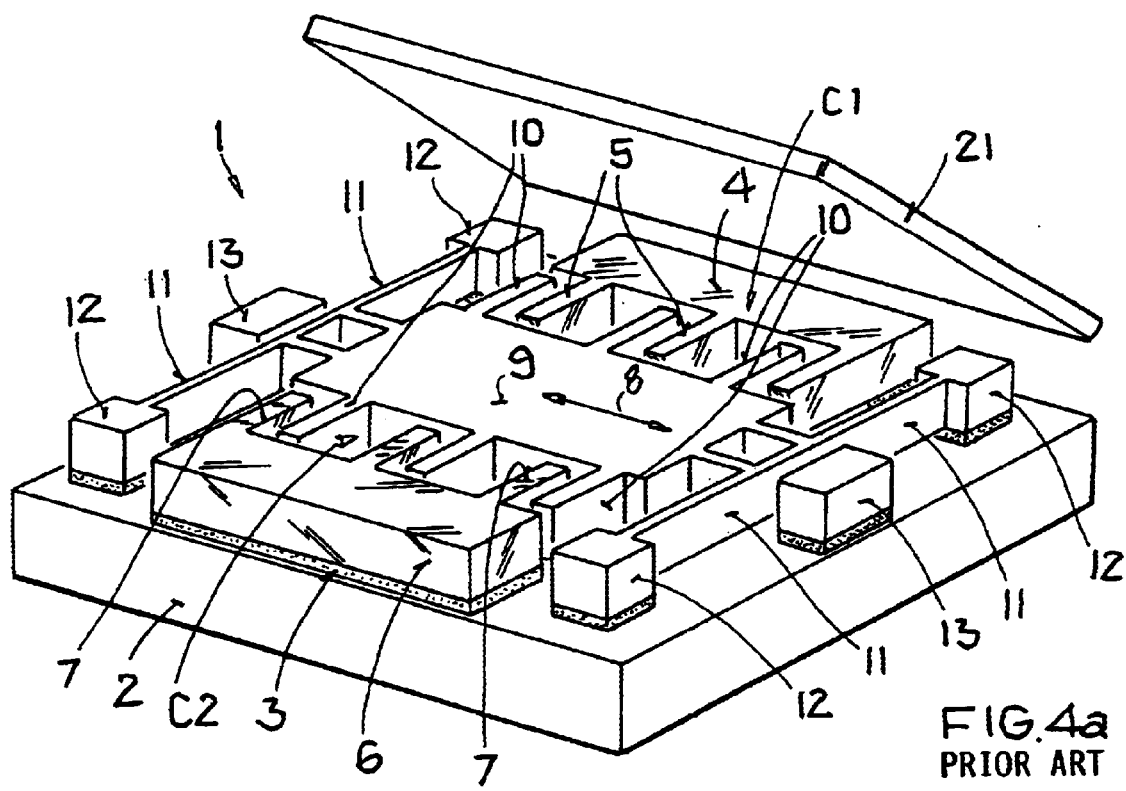

FIG. 4a shows the principle structure of a micromechanically manufactured acceleration sensor 1. A first fixed comb electrode 4 with fingers 5, as a first capacitor C1, and a second fixed comb electrode 6 with fingers 7, as a second capacitor C2, are arranged on an n-conducting substrate 2 (base wafer) and an insulating $SiO_2$ layer 3. An electrode 9 with fingers 10, which is moveable in the direction of an arrow 8, is located as a seismic mass between the first fixed comb electrode 4 and the second fixed comb electrode 6. The moveable electrode 9 is attached to two fixed holding blocks 12 by means of two arms 11. A stop 13 prevents the fingers 10 from touching the fingers 5 or 7. Finally, a cover in the form of a hermetically sealing lid 21, made of silicon or similar materials, ensures that the capacitive acceleration sensor 1 is protected against external influences.

Should an acceleration force act on the moveable electrode 9, as a seismic mass, said electrode is deflected in its sensitive direction, indicated by the arrow 8. In so doing, one of the two capacitances C1 or C2 between the moveable electrode 9 and the fixed comb electrode 4 or 6 is increased, while the other of the two capacitances C1 or C2 is simultaneously reduced.

This principle of operation is shown in FIG. 4b. The fingers 5 of the first fixed comb electrode 4 form the capacitor C1, whereas the capacitor C2 is formed by the fingers 7 of the second fixed comb electrode 6. The capacitor C1 is measured between a connection W1 (wall 1) of the first fixed comb electrode 4 and a center tap c (center) of the moveable electrode 9, the capacitor C2 is measured between a connection W2 (wall 2) of the second fixed comb electrode 6 and the center tap c of the moveable electrode 9.

When acceleration forces cause the moveable electrode 9 to move in the direction of the arrow 8, the capacitances C1 and C2 change in the manner already described. The fingers 5, 7 and 10, which are electrically isolated from one another, form a differential capacitor with a capacitance ranging from a few hundred fF up to approximately 600 fF.

The equivalent circuit diagram shown in FIG. 4c, derived from the acceleration sensor 1, consists of the variable capacitors C1 and C2, in which each capacitor C1 and C2 is composed of at least two parallel connected capacitors. Should the capacitance C1 increase by a specific value as a result of acceleration forces, then the capacitance C2 falls by this value, and vice versa.

The Course of the Electrical Testing Method

The covers 21 of the finished processed wafers are either sawn down to the base wafer 2 as sensor elements or the sensors 1 are sawn completely free on the wafer saw as DIEs. The sawn wafer is then put in a vessel and exposed to a vacuum of $5 \cdot 10^{-1}$ mbar for thirty minutes. After flooding with a suitable test fluid, for example with a FLUOROCARBON for example FC 40 FC 72, EC 75, FC 77 produced by the Minnesota Manufacturing and Mining company, the test piece is exposed to the vacuum for a further thirty minutes. During this, TIME the wafer must be completely surrounded by the test fluid.

After bringing the vacuum up to normal pressure, the wafer remains in the same vessel and is immersed in the same testing medium. A defined overpressure of 8 bar is then generated in the vessel, and the test piece is exposed to these conditions for one hour.

After pumping out the test fluid and opening the vessel, the test piece (wafer) is removed. The wafer is held at an inclined angle for two minutes to allow it to drain before the wafer is removed from the vessel. After the wafer has been lightly blown off with a nitrogen jet, the wafer is placed in a nitrogen box to dry at room temperature. Any test fluid which had not been completely removed from the surface of the wafer evaporates within a period of fifteen minutes without leaving any residue. The wafer must now be electrically tested (wafer test) within twelve hours.

Wafer Test

As already mentioned, an untight sensor cavity is detected by the increase in the sensor capacitance as measured by an LCR meter capable of measuring inductance (L), capacitance (C) and resistance (R) under the defined test conditions f=400 kHz; U=0.5 $V_{rms}$ wherein U is a voltage for C and $C_{pd}$.

Depending upon the test fluid used, with a dielectric constant, in the case of coarser leak rates (ca. $10^{-2}$ mbar·dm$^1$·s$^{-1}$) one can expect the test fluid to penetrate and almost completely wet the sensor finger structure. The capacitance of the sensor fingers 5, 7, 10 in the rest position thereby increases by a factor corresnonding to the dielectric constant of the test fluid. In this case, the increase in capacitance is substantially different from that of tight reference sensors and may be used as an unambiguous test criterion within the wafer test.

Figure 1:
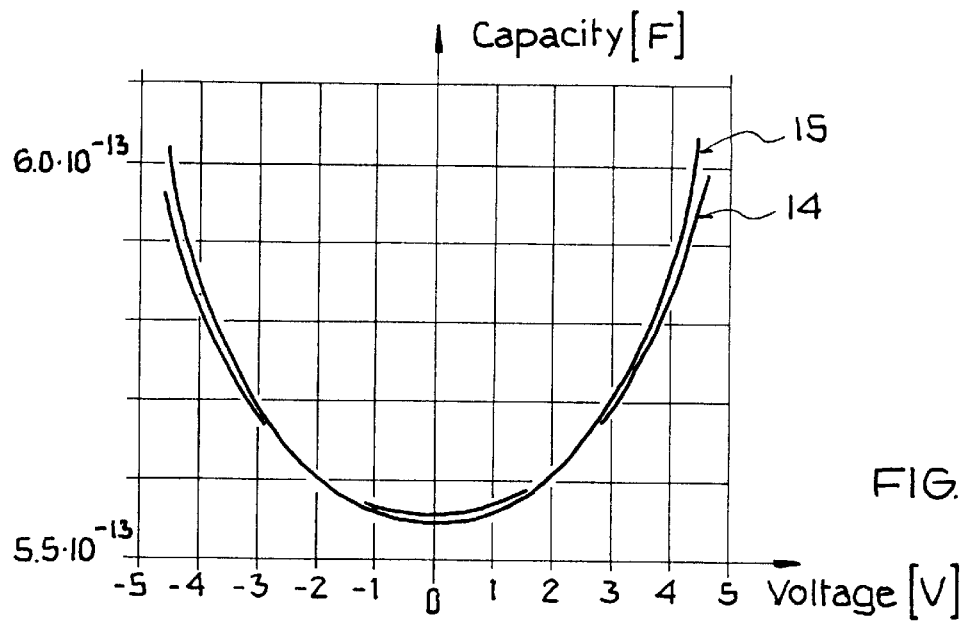
FIG. 1: the typical curve of capacitance against voltage in the case of a tight acceleration sensor.

FIG. 1 shows the typical curve of the capacitance against the voltage in the case of a tight acceleration sensor 1, its so-called CV characteristic (C stands for the capacitance, V stands for the voltage). Here, a first curve 14 shows the capacitance of the first variable capacitor C1 measured between the measuring point W1 and the center tap c, and a second curve 15 shows the capacitance of the second variable capacitor C2 measured between the measuring point W2 and the center tap c. Both measurements show a curve of the sensor characteristic which runs symmetrically on the voltage axis for both variable capacitors C1 and C2.

Figure 2:
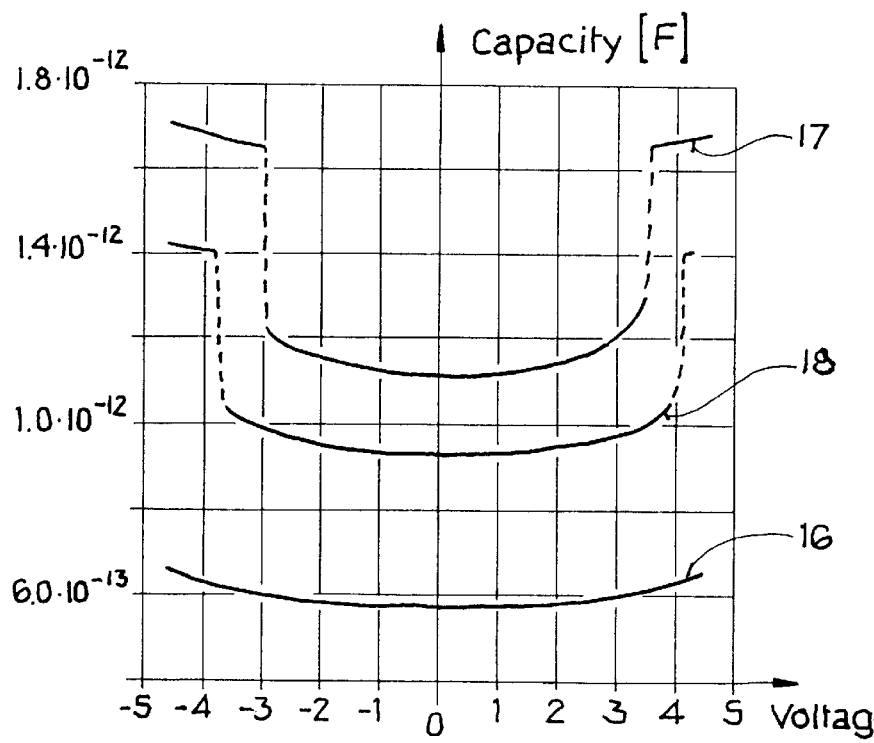
FIG. 2: the typical curve of capacitance against voltage in the case of an untight acceleration sensor with a high leak rate.

FIG. 2 shows three curves of the capacitance against the voltage for an untight acceleration sensor 1 with a high leak rate (ca. $10^{-2}$ mbar·dm$^3$·s$^{-1}$). A first curve 16 shows the course of the variable capacitance C1 or C2 before the acceleration sensor 1 has been subjected to the seal test described. The curve 16 shows a curve of the sensor characteristic which is symmetrical on the voltage axis.

A second curve 17 shows the course of the variable capacitance C1 or C2 immediately after the acceleration sensor 1 has been subjected to the seal test described. The curve 17 shows a course of the sensor characteristic that is clearly asymmetrical on the voltage axis, in which the capacitance increases steeply on one side at +3.3 V and on the other side at −2.8 V. The capacitance of the variable capacitors C1 or C2 has approximately doubled as a consequence of the penetration of the test fluid.

A third curve 18 shows the course of the variable capacitance C1 or C2 48 hours after the acceleration sensor 1 has been subjected to the seal test described. The curve 18 again shows a course of the sensor characteristic that is clearly asymmetrical on the voltage axis, in which the capacitance increases steeply on one side at +4.0 V and on the other side at −3.6 V. The course of the curve 18 shows that an untight acceleration sensor 1 can still be distinguished from a tight one even 48 hours after the described seal test has been carried out.

An extended electrical test method, as described in the following, is required for finer leak rates in the range of ca. $10^{-4}$ mbar·dm$^3$·s$^{-1}$.

The Course of the Extended Electrical Testing Method

The working principle of the extended electrical test method is that tiny particles of the penetrating test fluid remain adhered to the sensor fingers 5, 7 and 10 (FIGS. 4a, b). These Flourinert Dielektrika are polarized in the electrical field by electrical influence. Penetrating particles of the test fluid have an electrically measurable effect on the sensor characteristic.

An additional direct voltage (bias) is superimposed on the measuring alternating voltage during the measurement of the capacitance. While doing so, the moveable sensor structure 9 with its fingers (moving fingers) 10 is moved along into the area of the stop 13 (over force stopper) by the electrical force field generated.

In the case of the measured sensors 1, the bias voltage required lies at 4.5 volts and tests the sensor response in both directions of polarity (+4.5 V and −4.5 V). The large electrical force field generated by the high bias voltage exerts a strong attractive force on the moving fingers 10, which leads to a minimal plate gap.

As already described and shown in FIG. 1, a CV characterization on tight reference sensors shows a symmetrical and typically parabolic curve for the capacitance up into the stop area (over force stopper). In the case of untight sensors 1, this symmetrical curve of the sensor capacitance remains disturbed for a long time.

This is caused by polarized particles of the test fluid penetrating into the cavity and some of them adhering to the sensor fingers 5, 7 and 10. In so doing, surface forces effect a local increase in the attractive and repulsive reactions between the sensor fingers 5, 7 and 10. As a result of the high field strength concentration occurring in this area, the finger structure 5, 7 and 10 is elastically deformed and the gap further reduced, which in the extreme case may lead to the affected fingers 5, 7 and 10 touching.

Figure 3A:
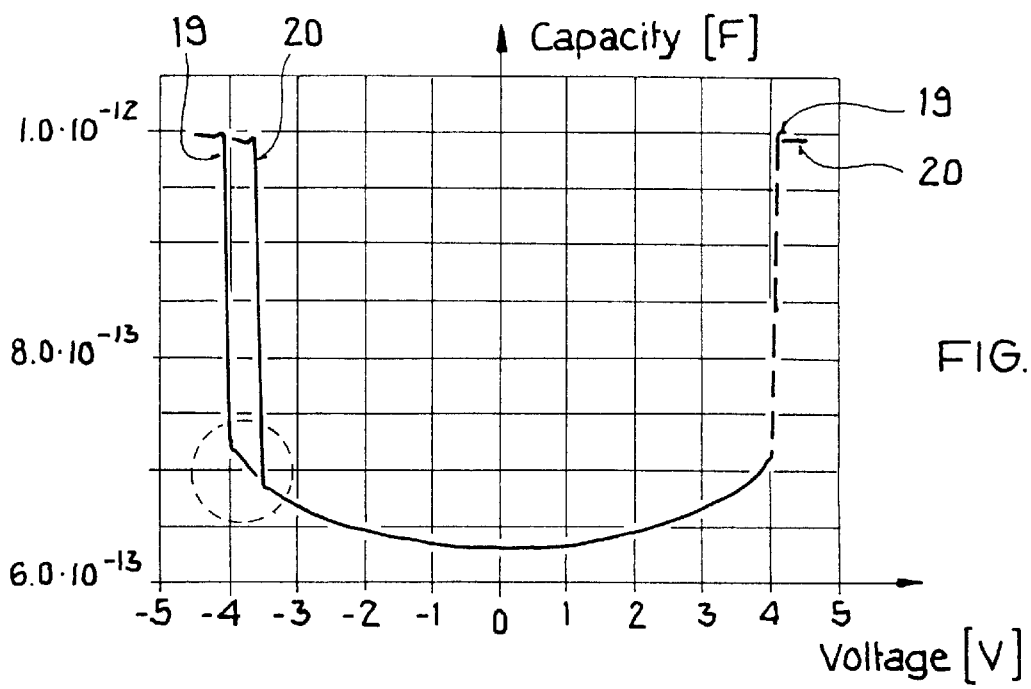
FIG. 3a: the typical curve of capacitance against voltage in the case of an untight acceleration sensor with a low leak rate, FIG. 3b a magnified section of the curve shown in FIG. 3a, FIG. 4a: the principle structure of a conventional micromechanical acceleration sensor.

This sensor response is detectable in the CV characteristic by a spontaneous, premature and frequently asymmetric capacitance change, as can be seen in FIGS. 3a and b. FIG. 3a shows a first curve 19, which illustrates the typical course of the capacitance change of a tight sensor 1 after the described, extended test method. In the case of a voltage ranging from ca. +4.0 V to −4.0 V, the capacitance of the sensor increases steeply from ca. $7 \cdot 10^{-13}$ F until the capacitance finishes in each case at ca. $1 \cdot 10^{-12}$ F in the stop area.

FIG. 3a also shows a second curve 20, which illustrates the typical course of the capacitance change of an untight sensor 1 with a leak rate in the range of ca. $10^{-4}$ mbar·dm$^3$·s$^{-1}$ after the described, extended test method. As in the case of a tight sensor 1, the capacitance changes sharply in the positive voltage range at ca. +4.0 V from, once again, ca. $7 \cdot 10^{-13}$ F up to ca. $1 \cdot 10^{-12}$ F (stop area). In contrast to that, the capacitance already changes, equally sharply, at −3.5 V, which leads to the asymmetrical course of the curve 20, as can be clearly seen in FIG. 3a.

Figure 3B:
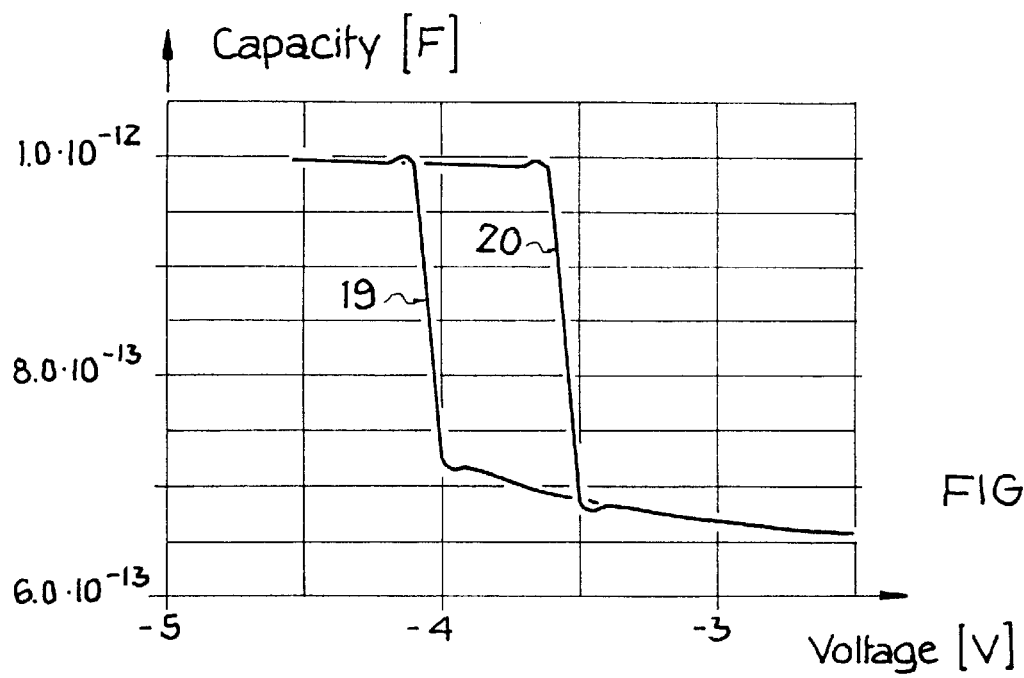

The steep increase in the capacitance in the negative voltage range is shown again in FIG. 3b in magnified form. This makes it clear that the course of the steep increase in the capacitance from ca. $7 \cdot 10^{-13}$ F up to ca. $1 \cdot 10^{-12}$ F in the stop area is almost the same in both curves 19, 20, nevertheless, the steep increase in capacitance of the tight sensor 1, shown in curve 19, takes place at −4.0 V, whereas the steep increase in capacitance of the untight sensor 1, shown in curve 20, already takes place at −3.5 V.

With the aid of the extended test method, it is therefore possible to unambiguously determine whether a micromechanically manufactured sensor 1, which has a leak rate of ca. $10^{-4}$ mbar·dm$^3$·s$^{-1}$, is tight or untight. It can be integrated into the wafer test as an unambiguous, electrically measurable test criterion within the scope of the parameter test.

This extended test method is also suitable for detecting other weak points in the sensor 1 (sticking, mouse bite, trench derivatives, foreign material etc.) by technical measurement of hermetically sealed sensors.

What is claimed is:

1. Method for testing the tightness of capacitive sensors arranged in a hermetically sealed enclosure, in which the processed sensors are arranged in the form of a wafer, wherein the already sawn wafer bearing the sensors is immersed in a test fluid under defined conditions, the capacitance of each sensor is then measured and compared with the capacitance of reference sensors.

2. Method according to claim 1, wherein the sawn wafer bearing the sensors is exposed to a vacuum in a vessel for a first time before being immersed in the test fluid for a defined period of time.

3. Method according to claim 2, wherein the vessel is flooded with the test fluid after the sawn wafer bearing the sensors has been exposed to the vacuum for a first time.

4. Method according to claim 3, wherein the wafer in the vessel is exposed for a defined period of time to a vacuum for a second time after the vessel has been flooded with the test fluid.

5. Method according to claim 4, wherein normal air pressure is generated in the vessel after the sawn wafer bearing the sensors has been exposed to the vacuum for a second time.

6. Method according to claim 5, wherein an overpressure is generated in the vessel for a defined period of time after normal air pressure has been generated.

7. Method according to claim 6, wherein the sawn wafer bearing the sensors is removed from the vessel and dried after the generation of the overpressure.

8. Method according to claim 7, wherein each sensor on the wafer is tested in the wafer test by measuring its capacitance after the sawn wafer bearing the sensors has been dried.

9. Method according to claim 2, wherein the already sawn wafer bearing the sensors is exposed to a vacuum of $5 \cdot 10^{-1}$ mbar in the vessel for 30 minutes.

10. Method according to claim 3, wherein the vessel is flooded with the test fluid selected from fluorocarbons.

11. Method according to claim 4, wherein the wafer in the vessel is exposed to a vacuum of $5 \cdot 10^{-1}$ mbar for a second time for 30 minutes after the vessel has been flooded with the test fluid.

12. Method according to claim 6, wherein an overpressure of 8 bar is generated in the vessel for a defined period of time of 1 hour.

13. Method according to claim 7, wherein the wafer is placed in a nitrogen box to dry at room temperature for 15 minutes.

14. Method according to claim 1, wherein the capacitance of each sensor is measured by means of an LCR meter.

15. Method according to claim 14, wherein the capacitance is measured with a measuring alternating voltage of U=0.5 $V_{rms}$ and a frequency of f=400 kHz in order to determine coarse leak rates.

16. Method according to claim 15, wherein the measuring alternating voltage is superimposed with an additional direct voltage in order to determine fine leak rates.

17. Method according to claim 16, wherein the measuring alternating voltage is on the one hand superimposed with a positive additional direct voltage and on the other hand with a negative additional direct voltage.

18. Method according to claim 17, wherein the measuring alternating voltage is superimposed with an additional direct voltage of 4.5 V.

* * * * *

UNITED STATES PATENT AND TRADEMARK OFFICE
CERTIFICATE OF CORRECTION

PATENT NO. : 6,675,633 B2
DATED : January 13, 2004
INVENTOR(S) : Cramer

It is certified that error appears in the above-identified patent and that said Letters Patent is hereby corrected as shown below:

Column 3,
Line 41, after "C", insert -- [capacitance] --;
Line 42, replace "$C_{pd}$." by -- $C_{pD}$ [capacitance with dissipation factor, equivalent circuit with an assumed resistor connected in parallel to the capacitor]. --;
Line 45, before "one", replace "mbar·dm$^1$·s$^{-1}$)" by -- mbar·dm$^3$·s $^{-1}$) --;
Line 48, before "to", replace "corresnonding" by -- corresponding --.

Signed and Sealed this

Twenty-third Day of March, 2004

JON W. DUDAS
*Acting Director of the United States Patent and Trademark Office*